(12) United States Patent
Su et al.

(10) Patent No.: US 9,691,840 B2
(45) Date of Patent: Jun. 27, 2017

(54) CYLINDRICAL EMBEDDED CAPACITORS

(71) Applicant: Taiwan Semiconductor Manufacturing Company, Ltd., Hsin-Chu (TW)

(72) Inventors: An-Jhih Su, Bade (TW); Chi-Chun Hsieh, Tongluo Township (TW); Tzu-Yu Wang, Taipei (TW); Wei-Cheng Wu, Hsin-Chu (TW); Hsien-Pin Hu, Zhubei (TW); Shang-Yun Hou, Jubei (TW); Wen-Chih Chiou, Zhunan Township (TW); Shin-Puu Jeng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 365 days.

(21) Appl. No.: 14/132,563

(22) Filed: Dec. 18, 2013

(65) Prior Publication Data

US 2014/0106536 A1 Apr. 17, 2014

Related U.S. Application Data

(62) Division of application No. 12/873,931, filed on Sep. 1, 2010, now Pat. No. 8,693,163.

(51) Int. Cl.
*H01L 21/00* (2006.01)
*H01L 49/02* (2006.01)
(Continued)

(52) U.S. Cl.
CPC ........ *H01L 28/40* (2013.01); *H01L 21/76898* (2013.01); *H01L 23/481* (2013.01); *H01L 24/11* (2013.01); *H01L 24/14* (2013.01); *H01L 28/92* (2013.01); *H01L 24/13* (2013.01); *H01L 2224/0401* (2013.01);
(Continued)

(58) Field of Classification Search
CPC ...................................................... H01L 28/40
See application file for complete search history.

(56) References Cited

U.S. PATENT DOCUMENTS 5,391,917 A 2/1995 Gilmour et al.
5,510,298 A 4/1996 Redwine
(Continued)

FOREIGN PATENT DOCUMENTS

CN 1507046 6/2004

OTHER PUBLICATIONS

Giraudin, J.C. et al., "Development of Embedded Three-Dimensional 35-nF/mm2 MIM Capacitor and BICMOS Circuits Characterization," IEEE Journal of Solid-State Circuits, vol. 42, No. 9, Sep. 2007, pp. 1842-1850.
(Continued)

*Primary Examiner* — William Harriston
(74) *Attorney, Agent, or Firm* — Slater Matsil, LLP (57) ABSTRACT

A device includes a substrate having a front surface and a back surface opposite the front surface. A capacitor is formed in the substrate and includes a first capacitor plate; a first insulation layer encircling the first capacitor plate; and a second capacitor plate encircling the first insulation layer. Each of the first capacitor plate, the first insulation layer, and the second capacitor plate extends from the front surface to the back surface of the substrate.

20 Claims, 7 Drawing Sheets

(51) Int. Cl.
*H01L 21/768* (2006.01)
*H01L 23/48* (2006.01)
*H01L 23/00* (2006.01)

(52) U.S. Cl.
CPC ............ *H01L 2224/05008* (2013.01); *H01L 2224/0557* (2013.01); *H01L 2224/131* (2013.01); *H01L 2224/13025* (2013.01); *H01L 2224/13099* (2013.01); *H01L 2224/13147* (2013.01); *H01L 2224/1403* (2013.01); *H01L 2224/14181* (2013.01); *H01L 2924/00014* (2013.01); *H01L 2924/014* (2013.01); *H01L 2924/01006* (2013.01); *H01L 2924/01013* (2013.01); *H01L 2924/01019* (2013.01); *H01L 2924/01029* (2013.01); *H01L 2924/01032* (2013.01); *H01L 2924/01033* (2013.01); *H01L 2924/01049* (2013.01); *H01L 2924/01074* (2013.01); *H01L 2924/01078* (2013.01); *H01L 2924/14* (2013.01)

(56) References Cited

U.S. PATENT DOCUMENTS

| | | | |
|---|---|---|---|
| 5,767,001 | A | 6/1998 | Bertagnolli et al. |
| 5,998,292 | A | 12/1999 | Black et al. |
| 6,184,060 | B1 | 2/2001 | Siniaguine |
| 6,322,903 | B1 | 11/2001 | Siniaguine et al. |
| 6,448,168 | B1 | 9/2002 | Rao et al. |
| 6,465,892 | B1 | 10/2002 | Suga |
| 6,472,293 | B1 | 10/2002 | Suga |
| 6,538,333 | B2 | 3/2003 | Kong |
| 6,599,778 | B2 | 7/2003 | Pogge et al. |
| 6,639,303 | B2 | 10/2003 | Siniaguine |
| 6,664,129 | B2 | 12/2003 | Siniaguine |
| 6,693,361 | B1 | 2/2004 | Siniaguine et al. |
| 6,740,582 | B2 | 5/2004 | Siniaguine |
| 6,800,930 | B2 | 10/2004 | Jackson et al. |
| 6,841,883 | B1 | 1/2005 | Farnworth et al. |
| 6,882,030 | B2 | 4/2005 | Siniaguine |
| 6,924,551 | B2 | 8/2005 | Rumer et al. |
| 6,962,867 | B2 | 11/2005 | Jackson et al. |
| 6,962,872 | B2 | 11/2005 | Chudzik et al. |
| 7,030,481 | B2 | 4/2006 | Chudzik et al. |
| 7,049,170 | B2 | 5/2006 | Savastiouk et al. |
| 7,060,601 | B2 | 6/2006 | Savastiouk et al. |
| 7,071,546 | B2 | 7/2006 | Fey et al. |
| 7,111,149 | B2 | 9/2006 | Eilert |
| 7,122,912 | B2 | 10/2006 | Matsui |
| 7,157,787 | B2 | 1/2007 | Kim et al. |
| 7,193,308 | B2 | 3/2007 | Matsui |
| 7,262,495 | B2 | 8/2007 | Chen et al. |
| 7,297,574 | B2 | 11/2007 | Thomas et al. |
| 7,335,972 | B2 | 2/2008 | Chanchani |
| 7,355,273 | B2 | 4/2008 | Jackson et al. |
| 7,561,410 | B1 | 7/2009 | Lee et al. |
| 7,750,477 | B2 | 7/2010 | Sinha |
| 8,159,812 | B2 | 4/2012 | Eriksson |
| 8,202,801 | B1 | 6/2012 | Lin |
| 8,254,142 | B2 | 8/2012 | Chen |
| 8,519,515 | B2 | 8/2013 | Kuo et al. |
| 2002/0017399 | A1 | 2/2002 | Chang et al. |
| 2003/0057558 | A1* | 3/2003 | Akiyama .......... H01L 21/76802 257/758 |
| 2003/0111733 | A1* | 6/2003 | Pogge ................. H01L 21/6835 257/774 |
| 2006/0001174 | A1 | 1/2006 | Matsui |
| 2008/0122031 | A1 | 5/2008 | DeNatale et al. |
| 2009/0090995 | A1 | 4/2009 | Yang et al. |
| 2010/0308435 | A1* | 12/2010 | Nowak ............. H01L 21/76898 257/532 |
| 2011/0169131 | A1 | 7/2011 | Nakos et al. |
| 2011/0177670 | A1 | 7/2011 | Herrin et al. |
| 2012/0091593 | A1 | 4/2012 | Cheng et al. |
| 2012/0181658 | A1 | 7/2012 | Mohammed et al. |

OTHER PUBLICATIONS

Roozeboom, F., et al., "ALD Options for Si-Integrated Ultrahigh-density Decoupling Capacitors in Pore and Trench Designs," ESC Transactions, 3 (15) pp. 173-181, 2007, The Electrochemical Society.

Roozeboom, F., et al., "Passive and heterogeneous integration towards a Si-based System-in-Package concept," Thin Solid Films 504, 2006, pp. 391-396, Elsevier.

Roozeboom, F., et al., "Ultrahigh-density trench capacitors in silicon and their application to integrated DC-DC conversion," Procedia Chemisty 1, 2009, pp. 1435-1438, Elsevier.

* cited by examiner

CYLINDRICAL EMBEDDED CAPACITORS

This application is a divisional of U.S. patent application Ser. No. 12/873,931, entitled "Cylindrical Embedded Capacitors," filed on Sep. 1, 2010, which application is incorporated herein by reference.

BACKGROUND

Large capacitors with high capacitance values require large chip area, and hence result in difficulty in the formation of integrated circuits. Conventional capacitors include planar-type capacitors and trench-type MOS capacitors. The capacitor plates of the planar-type capacitors are parallel to the major surfaces of the respective substrate. The process for forming the planar-type capacitors is simple. However, planar-type capacitors also require large areas.

On the other hand, trench-type MOS capacitors comprise vertical portions perpendicular to the major surface of the respective substrates, and extending into the respective substrates, and hence the required chip areas are reduced. However, the process for forming the trench-type MOS capacitors is complicated.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 9A are cross-sectional views of intermediate stages in the manufacturing of an embedded capacitor in a substrate in accordance with an embodiment;

FIGS. 10A through 11 illustrate cross-sectional views of capacitors in accordance with alternative embodiments.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel capacitor and the method of forming the same are presented in accordance with an embodiment. The intermediate stages of manufacturing an embodiment are illustrated. The variations of the embodiment are then discussed. Throughout the various views and illustrative embodiments, like reference numbers are used to designate like elements.

Figure 1:
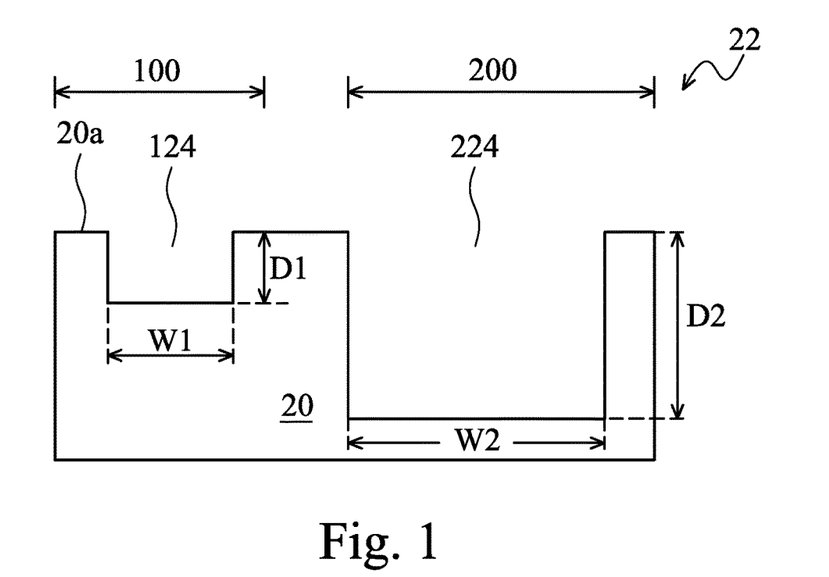
Figure 9A:
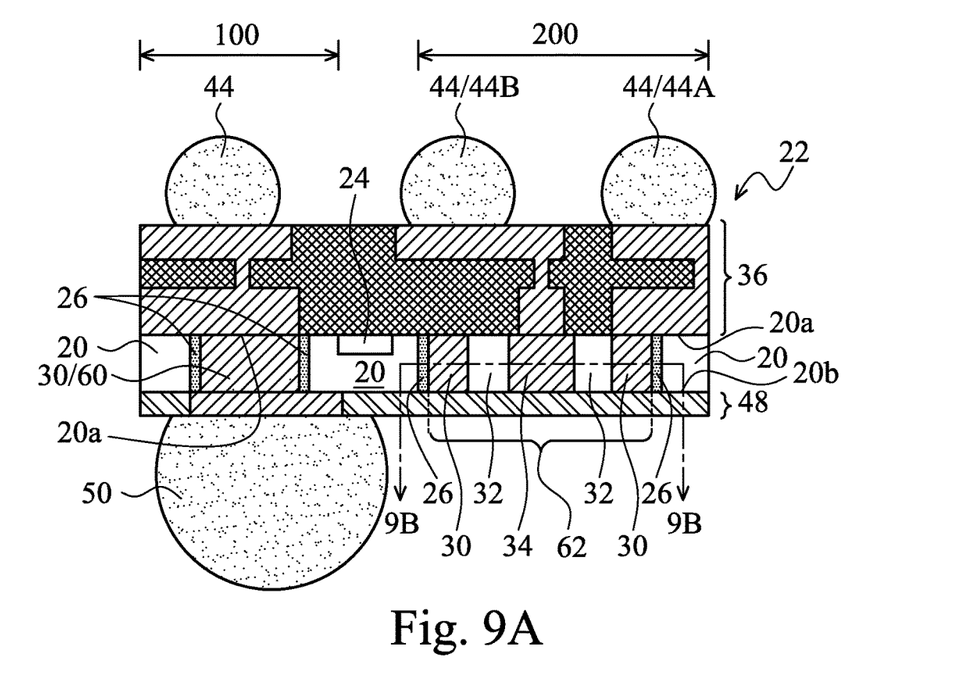

Referring to FIG. 1, substrate 20, which is a part of wafer 22, is provided. In an embodiment, substrate 20 is a semiconductor substrate, which may be a silicon substrate, for example. Other commonly used materials, such as carbon, germanium, gallium, arsenic, nitrogen, indium, phosphorus, and/or the like, may also be included in substrate 20. Substrate 20 may be formed of a single-crystalline or a compound semiconductor material. In an embodiment, substrate 20 is an interposer substrate of an interposer, and there is substantially no active device such as transistors formed at surfaces of substrate 20. Passive devices such as capacitors, inductors, resistors, and the like, however, may, or may not, be formed in wafer 22. In alternative embodiments, substrate 20 is a portion of a device die, and hence integrated circuits such as transistors (not shown in FIG. 1, please refer to FIG. 9) may be formed at a surface of substrate 20. Substrate 20 may also be a dielectric substrate formed of an organic material, a ceramic material, or the like.

Substrate 20 includes portions in different regions 100 and 200. Region 100 is a through-substrate via (TSV) region, in which a TSV is to be formed. Region 200 is a capacitor region in which a capacitor is to be formed. In the illustrated exemplary embodiments, a TSV and a capacitor are simultaneously formed in regions 100 and 200, respectively. However, the TSV and capacitor may be formed by separate process steps.

Openings 124 and 224 are formed in substrate 20, and extend from front surface 20a of substrate 20 into substrate 20. The formation of openings 124 and 224 may include forming and patterning a photo resist (not shown), and then using the photo resist to etch substrate 20. The photo resist is then removed. In an embodiment, openings 124 and 224 have lateral dimensions W1 and W2, respectively, which may be a length/width or a diameter. Lateral dimension W2 may be greater than about 110 percent, 150 percent, or 200 percent lateral dimension W1. When openings 124 and 224 are formed simultaneously in a same etching step, due to the difference in lateral dimensions W1 and W2, depth D1 and D2 will also be different, with depth D2 greater than depth D1.

Figure 2:
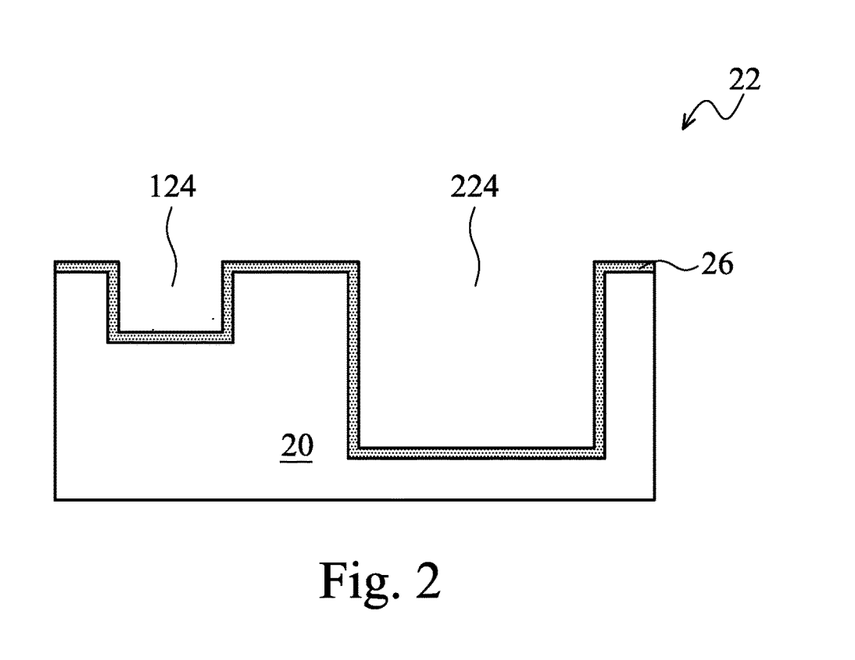

Referring the FIG. 2, isolation layer 26 (alternatively referred to as a liner) is formed to cover the bottoms and sidewalls of openings 124 and 224. In the embodiments wherein substrate 20 is a dielectric substrate, isolation layer 26 may be omitted. Isolation layer 26 may be formed of silicon oxide, silicon oxynitride, silicon nitride, or the like.

Figure 3:
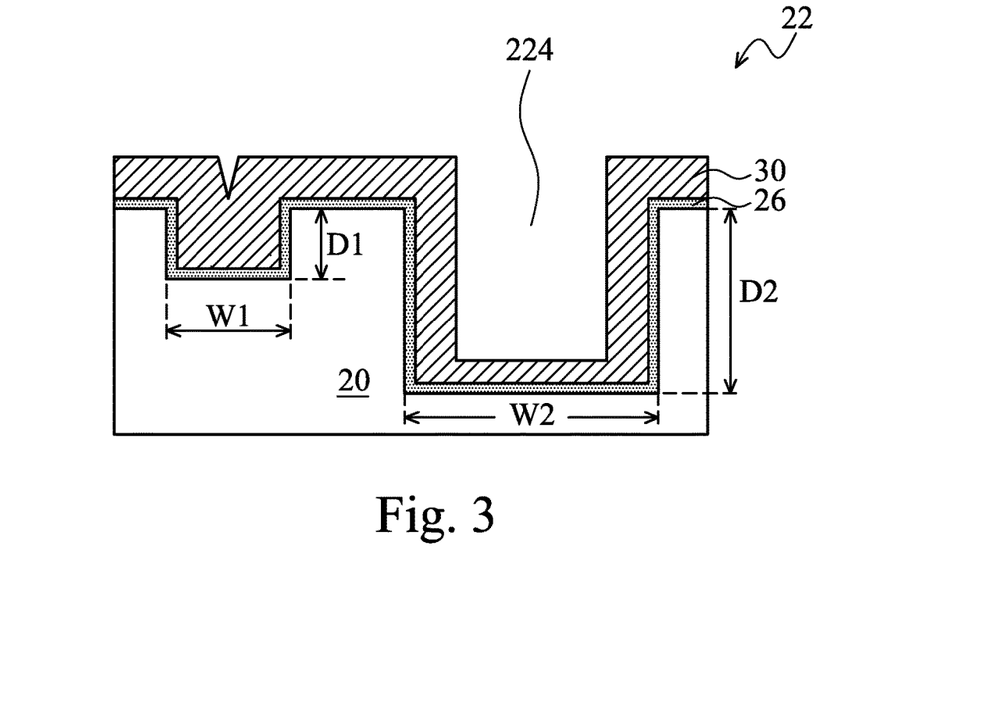

Referring to FIG. 3, conductive layer 30 is formed. The material of conductive layer 30 may include a metallic material such as copper or a copper alloy, although other metallic materials may be used. The material of conductive layer 30 may include a non-metallic material such as polysilicon. The formation of conductive layer 30 may include forming a seed layer using physical vapor deposition (PVD), for example, and then performing a plating to increase the thickness of conductive layer 30. Process may be controlled, and widths W1 and W2 and depths D1 and D2 are also selected, so that opening 124 is fully filled by conductive layer 30, while opening 224 is partially filled. Conductive layer 30 is formed as a conformal layer on the sidewalls and the bottom of opening 224.

Figure 4:
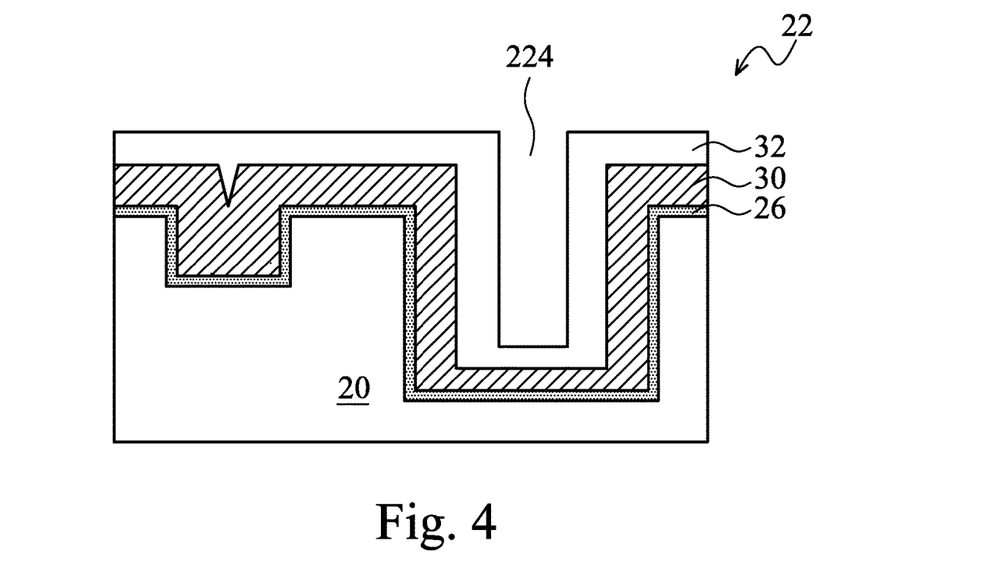

Insulation layer 32 is then formed, and partially fills opening 224, as is shown in FIG. 4. In an embodiment, insulation layer 32 is formed using a deposition technique for forming conformal dielectric layers, such as selective area chemical vapor deposition (SACVD), high aspect ratio process (HARP), or the like. Insulation layer 32 may include silicon nitride, silicon oxide, silicon oxynitride, or the like.

Figure 5:
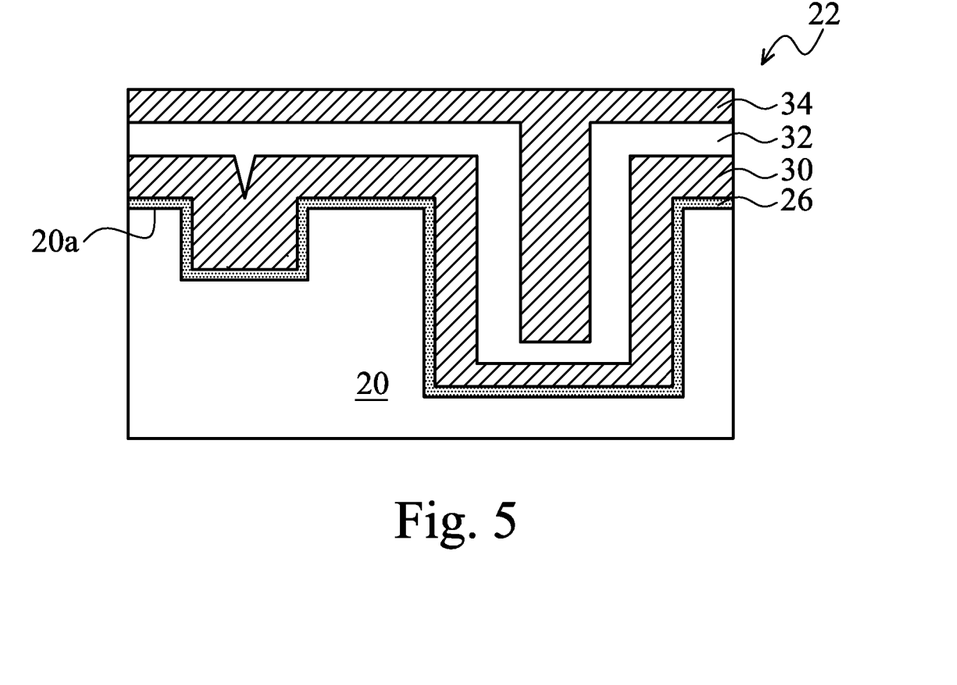
Figure 6:
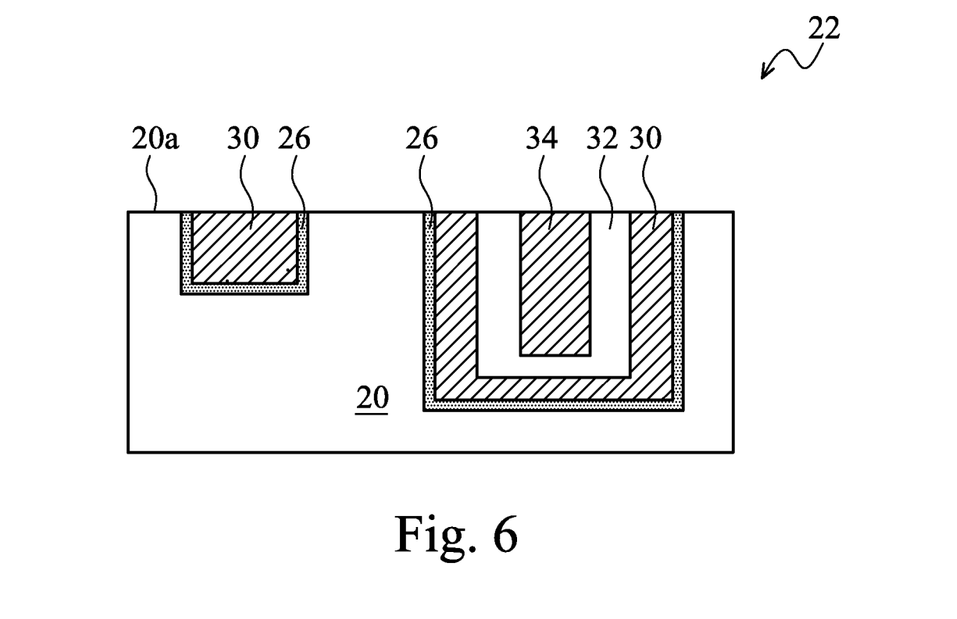

Referring to FIG. 5, the remaining portion of opening 224 is filled with conductive material 34. Conductive material layer 34 may include a metallic material such as copper, tungsten, aluminum, alloys thereof, and multi-layers thereof. The material of conductive material layer 34 may include a non-metallic material such as polysilicon. Next, as shown in FIG. 6, a planarization step is performed, so that excess portions of conductive material layer 34, insulation layer 32, and conductive layer 30 directly over top surface 20a of substrate 20 are removed. The planarization step may be performed using chemical mechanical polish (CMP).

Figure 7:
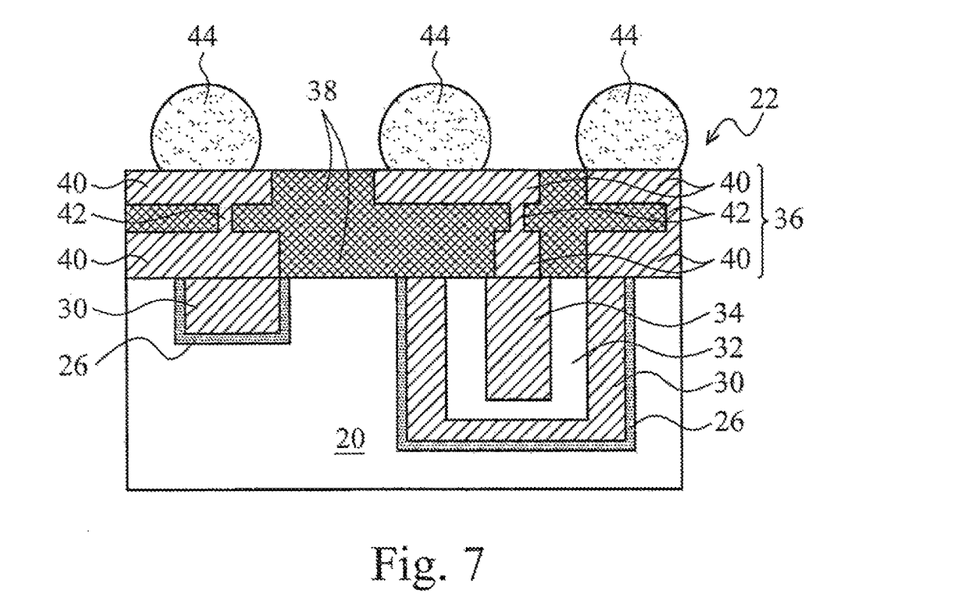

In FIG. 7, front-side interconnect structure 36 is formed. Front-side interconnect structure 36 may include one or a plurality of dielectric layers 38, and metal lines (redistribution lines) 40 and vias 42 in dielectric layers 38. In the embodiments wherein wafer 22 is a device wafer, dielectric layers 38 may include an inter-layer dielectric (ILD) and a plurality of inter-metal dielectrics (IMD), which may be formed of low-k dielectric materials with k values lower than 3.0, for example. Bumps 44 are then formed on the wafer 22. Bumps 44 may be copper pillar bumps, solder bumps, or any other type of commonly used bumps.

Figure 8:
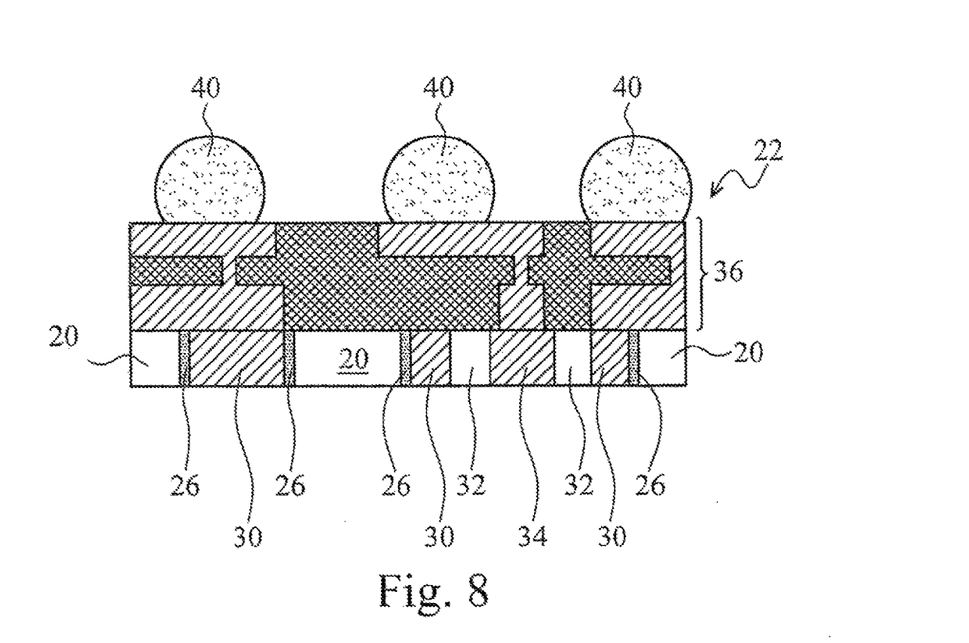

Referring to FIG. 8, in subsequent process steps, the backside of substrate 20 is grinded until conductive layer 30, insulation layer 32, and conductive layer 34 are exposed. Next, as shown in FIG. 9A, backside interconnect structure 48 is formed. Backside interconnect structure 48 may also comprise one or a plurality of dielectric layers, and redistribution lines and vias (not shown) in the dielectric layers. Metal bump 50, which may be a solder bump or a copper pillar bump, is formed on the backside of substrate 20.

In the structure shown in FIG. 9A, the remaining portion of conductive layer 30 in TSV region 100 forms TSV 60, which may be electrically coupled to metal bump 50 and one of metal bumps 44. The remaining portion of conductive layer 30, insulation layer 32, and conductive layer 34 in region 200 form capacitor 62, which includes conductive layer 30 and conductive layer 34 as two capacitor plates, and insulation layer 32 as the capacitor insulator. It is observed that each of capacitor plates 30 and 34 and capacitor insulator 32 extends from front surface 20a to back surface 20b of substrate 20. In an exemplary embodiment as shown in FIG. 9A, capacitor plate 30 is electrically coupled to front-side metal bump 44A, while capacitor plate 34 is electrically coupled to front-side metal bump 44B.

In the case wherein wafer 22 is a device wafer, active devices 24 may be formed at surface 20a of substrate 20. In some embodiments, TSV 60 and capacitor 62 may extend beyond front surface 20a of substrate 20. For example, TSV 60 and capacitor 62 may extend into the ILD (not shown) over active devices 24.

Figure 9B:
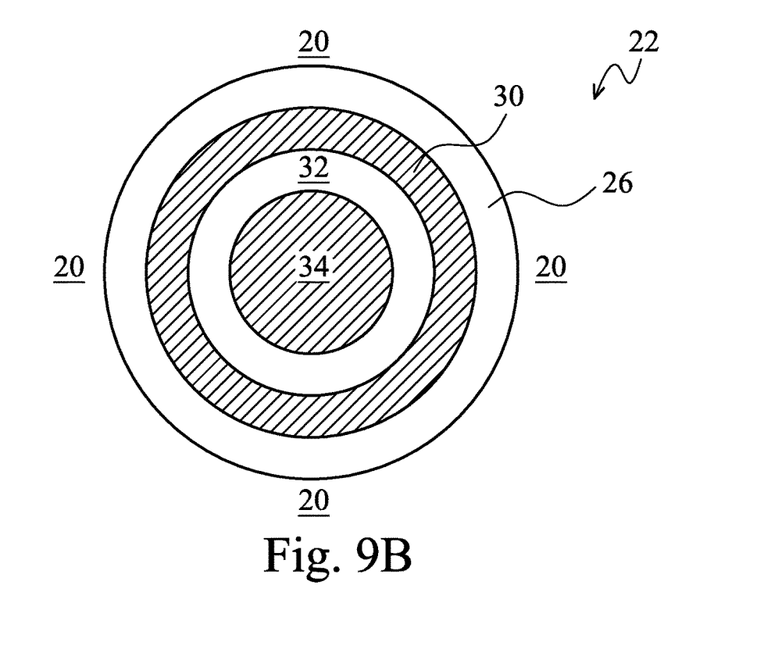
FIG. 9B illustrates a top view of the embedded capacitor as shown in FIG. 9A.

FIG. 9B illustrates a top view of a portion of the structure show in FIG. 9B, wherein the top view is obtained from the plane crossing line 9B-9B in FIG. 9A. It is observed that capacitor plate 30 has a ring shape, insulation layer 32 has a ring shape, and capacitor plate 34 has a cylindrical shape that is encircled by the ring-shaped plate 30 and layer 32. Further, capacitor 62 has a cylindrical shape. Although capacitor plate 30 and insulation layer 32 are shown as circular rings in FIG. 9B, they may also form rings having different shapes, for example, rectangular top-view shapes, depending on the top-view shape of opening 224 in FIG. 1.

Figure 10A:
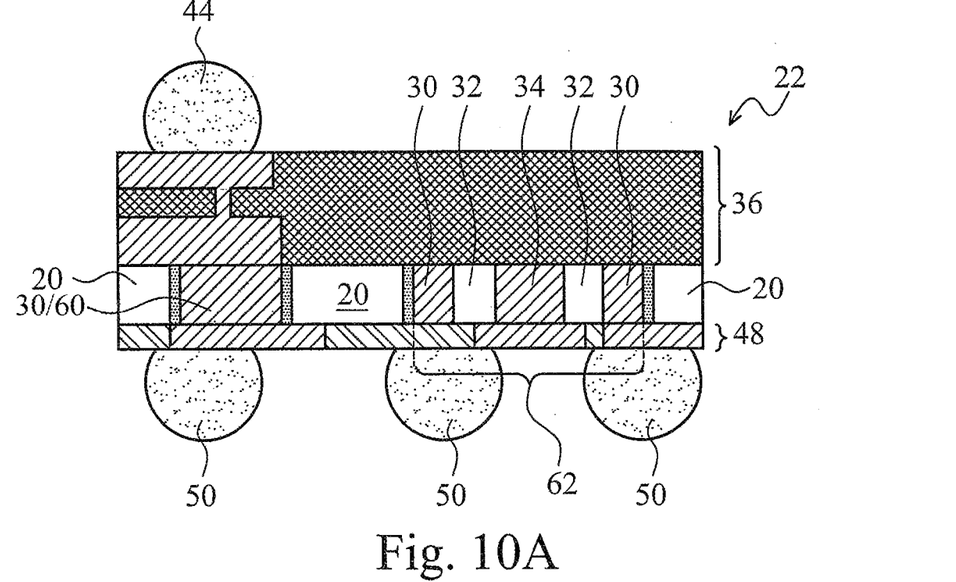
Figure 10B:
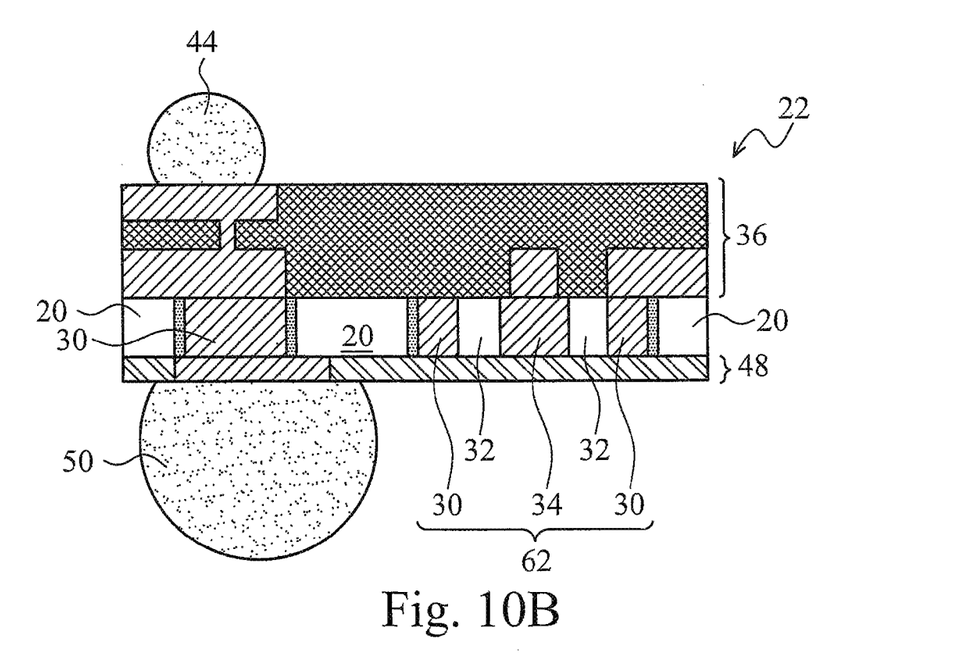

FIG. 10A illustrates embedded capacitor 62 in accordance with an alternative embodiment, wherein capacitor 62 is electrically coupled to backside metal bumps 50. In FIG. 10B, another embodiment is shown, in which no front-side metal bumps and no back-side metal bumps are electrically coupled to capacitor 62. In this embodiment, wafer 22 may be a device wafer, and capacitor 62 may be electrically coupled to the integrated circuits (not shown) formed in wafer 22.

Figure 11:
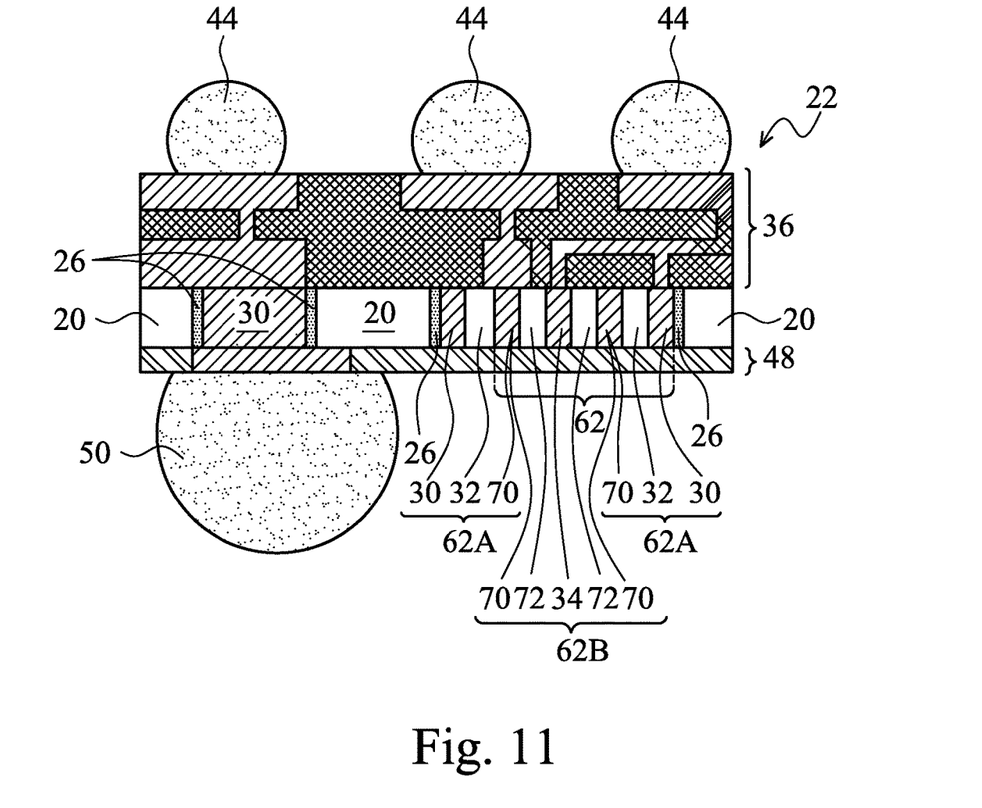

FIG. 11 illustrates an alternative embodiment, wherein cylindrical capacitor 62 includes two capacitor insulation layers and three capacitor plates. Capacitor insulator 32 and capacitor plates 30 and 70 form a first capacitor 62A, while capacitor insulator 72 and capacitor plates 70 and 34 form a second capacitor 62B, with the first and the second capacitors being coupled in parallel through a metal connection including metal line(s) 40 and vias 42. Accordingly, the capacitance of capacitor 62 equal to the sum of the capacitances of the first and the second capacitors. The formation process is similar to what are shown in FIGS. 1 through 9A, except conductive layer 70 and insulation layer 72 are formed between the step shown in FIG. 4 and the step shown in FIG. 5.

Since embedded capacitor 62 extends from front surface 20a to back surface 20b of substrate 20, the resulting capacitance of capacitor 62 is high due to the great depth of substrate 20. When formed in interposers that do not include active devices, capacitors 62 may use unused interposer area and no longer occupies chip area.

In accordance with an embodiment, device includes a substrate having a front surface and a back surface opposite the front surface. A capacitor is formed in the substrate and includes a first capacitor plate; a first insulation layer encircling the first capacitor plate; and a second capacitor plate encircling the first insulation layer. Each of the first capacitor plate, the first insulation layer, and the second capacitor plate extends from the front surface to the back surface of the substrate.

In accordance with other embodiments, a device includes an interposer, wherein no active device is formed in the interposer. The interposer includes a silicon substrate having a front surface and a back surface opposite the front surface; a capacitor extending from the top surface to the back surface; and an isolation layer extending from the top surface to the back surface, wherein the isolation layer is between and contacting the silicon substrate and the capacitor In accordance with yet other embodiments, a device includes a silicon substrate comprising a front surface and a back surface opposite the front surface, and a capacitor. The capacitor includes a first capacitor plate having a cylindrical shape; a first insulation layer encircling the first capacitor plate; a second capacitor plate encircling the first insulation layer; a second insulation layer encircling the second capacitor plate; and a third capacitor plate encircling the second insulation layer. The first, the second, and the third capacitor plates and the first and the second insulation layers extend from the front surface to the back surface of the silicon substrate. An isolation layer is disposed between and contacting the third capacitor plate and the silicon substrate, wherein the isolation layer extends from the front surface to the back surface of the silicon substrate.

In accordance with yet other embodiments, a method includes providing a substrate comprising a first surface and a second surface opposite the first surface; etching the substrate to form a first opening extending from the first surface into the substrate; forming a first conductive layer on sidewalls of the first opening; forming a first insulation layer in the first opening and over the first conductive layer; forming a second conductive layer in the first opening and over the first insulation layer; and grinding the second surface of the substrate until the first and the second conductive layers and the first insulation layer are exposed, wherein the first and the second conductive layers and the first insulation layer form a capacitor.

In accordance with yet other embodiments, a method includes providing a substrate comprising a front surface and a back surface opposite the front surface; etching the substrate to simultaneously form a first opening and a second opening extending from the front surface into the substrate; forming a first conductive layer to partially fill a portion of the first opening, wherein the second opening is fully filled with the first conductive layer; forming a first insulation layer in the first opening and over the first conductive layer; forming a second conductive layer in the first opening and over the first insulation layer; performing a planarization to remove excess portions of the first and the second conductive layers and the first insulation layer outside the first and the second openings; and grinding the back surface of the substrate until the first and the second conductive layers and the first insulation layer are exposed. The first and the second conductive layers and the first insulation layer form a capacitor in the first opening, and the first conductive layer forms a through-substrate via (TSV) in the second opening.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming a first opening in a first region of a substrate, wherein the first opening extends from a front surface of the substrate into the substrate;
    forming a second opening in a second region of the substrate, wherein the second opening extends from the front surface into the substrate;
    forming a first conductive layer to fully fill the first opening and partially fill a portion of the second opening;
    forming a first insulation layer over the first conductive layer;
    forming a second conductive layer over the first insulation layer;
    performing a planarization process to remove excess portions of the first conductive layer, the first insulation layer, and the second conductive layer, wherein the excess portions are outside the first opening and the second opening;
    forming a second insulation layer over the second conductive layer;
    forming a third conductive layer over the second insulation layer, wherein the second insulation layer and the third conductive layer are filled into the second opening; and
    after the third conductive layer is formed, grinding a back surface of the substrate to expose the first conductive layer, the first insulation layer and the second conductive layer, wherein the first conductive layer, the first insulation layer, and the second conductive layer form a capacitor in the second opening, and the first conductive layer forms a through-substrate via (TSV) in the first opening.

2. The method of claim 1, wherein the second opening has a second lateral dimension greater than a first lateral dimension of the first opening.

3. The method of claim 1, wherein the second opening has a second depth greater than a first depth of the first opening.

4. The method of claim 1, wherein the substrate is a semiconductor substrate, and the first opening and the second opening extend into the semiconductor substrate.

5. The method of claim 1 further comprising, before the step of forming the first conductive layer, forming an isolation layer in the first opening and the second opening.

6. The method of claim 5, wherein the isolation layer is a dielectric layer.

7. The method of claim 1, further comprising forming a metal bump over the front surface of the substrate, wherein the metal bump is electrically coupled to at least one of the capacitor and the TSV.

8. The method of claim 1, further comprising forming a metal bump underlying substrate, wherein the metal bump is electrically coupled to the TSV.

9. A method comprising:
    etching a semiconductor substrate to form a first opening and a second opening, wherein the first opening has a first lateral dimension smaller than a second lateral dimension of the second opening;
    forming an isolation layer in the first opening and the second opening simultaneously;
    forming a first conductive layer to fill in the first opening and the second opening simultaneously, with the first conductive layer being over the isolation layer, wherein the isolation layer and the first conductive layer fill an entirety of the first opening, and a part of the second opening;
    forming a first insulation layer over the first conductive layer, wherein the first insulation layer is filled into the second opening;
    forming a second conductive layer over the first insulation layer, wherein the second conductive layer is filled into the second opening;
    performing a planarization to remove excess portions of the isolation layer, the first conductive layer, the first insulation layer, and the second conductive layer, wherein the excess portions are over a top surface of the semiconductor substrate; and
    forming electrical connections to connect to a first portion of the first conductive layer and a second portion of the second conductive layer to form a capacitor, with the first portion and the second portion being in the second opening, wherein the electrical connections comprise solder bumps.

10. The method of claim 9 further comprising forming a dielectric layer underlying and in contact with bottom ends of the first portion and the second portion.

11. The method of claim 9 further comprising forming additional electrical connections to connect to opposite ends of a portion of the first conductive layer, wherein the portion of the first conductive layer is in the first opening.

12. The method of claim 11, wherein the electrical connections comprise solder bumps.

13. The method of claim 9 further comprising:
    forming a second insulation layer over the second conductive layer, wherein the second insulation layer is filled into the second opening; and
    forming a third conductive layer over the second insulation layer, wherein the third conductive layer is filled into the second opening.

14. The method of claim 9, wherein the first insulation layer and the second conductive layer are formed in the region directly over the first opening.

15. The method of claim 9 further comprising performing a backside grinding from a backside of the semiconductor substrate, wherein after the backside grinding, a bottom surface and a first portion and a second portion of the first conductive layer in the first opening and the second opening, respectively, are exposed.

16. The method of claim 9, wherein the isolation layer is a dielectric layer.

17. A method comprising:
etching a semiconductor substrate to form a first opening and a second opening, wherein the first opening has a first lateral dimension smaller than a second lateral dimension of the second opening, and wherein the first opening has a first depth smaller than a second depth of the second opening;
forming dielectric isolation layer, with the dielectric isolation layer comprising a first portion in the first opening and a second portion in the second opening;
forming a first conductive layer over the dielectric isolation layer, with the first conductive layer comprising:
a first portion in the first opening, wherein the first opening is fully filled by the first portion of the first conductive layer and the first portion of the dielectric isolation layer; and
a second portion filling a part of the second opening;
forming an insulation layer over the first conductive layer, wherein the insulation layer is filled into the second opening;
forming a second conductive layer over the insulation layer, wherein the second conductive layer comprises a portion filled into the second opening;
forming first electrical connections to connect to opposite ends of the first portion of the first conductive layer to form a through-substrate via; and
forming second electrical connections to connect to a top end of the second portion of the first conductive layer and a top end of the portion of the second conductive layer in the second opening to form a capacitor.

18. The method of claim 17 further comprising, after forming the second conductive layer, performing a planarization to expose a top surface of the semiconductor substrate, wherein the second electrical connections are formed after the planarization.

19. The method of claim 17 further comprising, after forming the second conductive layer, performing a backside grinding to expose a bottom end of the first portion of the first conductive layer, wherein the first electrical connections are formed after the backside grinding.

20. The method of claim 17, wherein the first electrical connections and the second electrical connections comprise solder bumps.

* * * * *